(12) United States Patent
Fischer et al.

(10) Patent No.: US 6,220,715 B1
(45) Date of Patent: Apr. 24, 2001

(54) METHOD AND DEVICE FOR REMOVING LIGHT

(75) Inventors: Jörg Achim Fischer; Thomas Jacobsen, both of Kiel (DE)

(73) Assignee: Heidelberger Druckmaschinen Aktiengesellschaft, Heidelberg (DE)

( * ) Notice: Subject to any disclaimer, the term of this patent is extended or adjusted under 35 U.S.C. 154(b) by 0 days.

(21) Appl. No.: 09/424,995

(22) PCT Filed: May 27, 1998

(86) PCT No.: PCT/DE98/01446
§ 371 Date: Feb. 22, 2000
§ 102(e) Date: Feb. 22, 2000

(87) PCT Pub. No.: WO98/56165
PCT Pub. Date: Dec. 10, 1998

(30) Foreign Application Priority Data

Jun. 3, 1997 (DE) .............................................. 197 23 170

(51) Int. Cl.[7] .................................................. G02B 27/00
(52) U.S. Cl. .................... 359/614; 359/615; 359/884; 359/859
(58) Field of Search ...................... 359/614, 615, 359/884, 859, 863, 866, 727, 728, 729, 305

(56) References Cited

U.S. PATENT DOCUMENTS

| | | | |
|---|---|---|---|
| 3,984,157 | 10/1976 | LeVantine ................................. | 351/9 |
| 4,000,493 | 12/1976 | Spaulding et al. .................... | 346/108 |
| 4,057,815 | 11/1977 | Johnson ................................. | 354/288 |
| 4,267,523 | 5/1981 | Brown ................................. | 331/94.56 |
| 4,703,187 | 10/1987 | Höfling et al. ......................... | 280/571 |
| 4,747,673 | 5/1988 | Marrs et al. ........................... | 359/372 |
| 4,863,253 * | 9/1989 | Shafer et al. ........................... | 359/859 |
| 5,072,239 | 12/1991 | Mitcham et al. ..................... | 346/108 |
| 5,457,567 | 10/1995 | Shinohara ............................ | 359/305 |
| 5,519,534 * | 5/1996 | Smith et al. ........................... | 359/599 |

FOREIGN PATENT DOCUMENTS

| | | |
|---|---|---|
| 27 38 667 | 3/1979 | (DE) . |
| 31 18 459 | 1/1984 | (DE) . |
| 31 18 458 | 11/1984 | (DE) . |
| 38 41 979 | 6/1990 | (DE) . |
| 195 30 395 | 11/1996 | (DE) . |
| 0 533 346 | 3/1993 | (EP) . |

OTHER PUBLICATIONS

Patent Abstracts of Japan—01146386—08–06–89.

* cited by examiner

*Primary Examiner*—Mohammad Sikder
(74) *Attorney, Agent, or Firm*—Schiff Hardin & Waite

(57) ABSTRACT

In a method and device for removing light by absorption, undesired light is guided by a light entrance aperture into a hollow body having a light-absorbing inner surface. The light which is directed into the hollow body falls onto the reflection surface of a reflector. The reflection surface is configured and positioned in such a way that the light which is reflected back from the reflection surface is not reflected in itself, that only a minor amount of said light does not reach the outside as scattered light via the light entrance aperture and that a substantial amount of the light reaches the inside of the hollow body where it is absorbed. The invention finds particular use in an electronic recording device for point and line elimination of a recording material with a laser beam, wherein an undesired secondary beam is absorbed according to the inventive method in order to avoid disturbing retroreflections.

13 Claims, 3 Drawing Sheets

METHOD AND DEVICE FOR REMOVING LIGHT

BACKGROUND OF THE INVENTION

The invention is in the field of electronic reproduction technology and is directed to a method and to an apparatus for the elimination of light by absorption.

The method and the apparatus are employed, for example, in an electronic recording device for point-by-point and line-by-line exposure of a recording medium with a laser beam.

In a recording device, also called an exposer or recorder, a laser beam modulated by a video signal is conducted point-by-point and line-by-line across a recording material to be exposed. The recording material is thereby fixed on a holder that moves relative to the light beam. In the case of an inside-drum recording device, the recording material is fixed on a stationary holder or exposure trough shaped like a cylindrical segment, and the laser beam is conducted across the recording material point-by-point and line-by-line with a rotating light beam deflection unit. The recording device, however, can also be designed as a drum device or flat bed device.

For direct exposure of printing plates, a laser beam having a high light power is required, this being generated in a laser light source for example in the form of a YAG laser. The modulation of the laser beam by the video signal occurs in a video modulator that, for example, is designed as an acousto-optical modulator (AOM). The acousto-optical modulator uses the input laser beam to generate essentially a used output laser beam of the first order, referred to below as an illumination beam, and an unused output laser beam of the 0 order, referred to below as a secondary beam.

While the illumination beam is being conducted across the recording material point-by-point and line-by-line with the rotating light beam deflection unit, the undesired secondary beam must be absorbed in a device, called a light sump or a light trap (beam dump).

There is a similar problem when a controlled light beam deflector that deflects the light beam employed for the illumination into the light trap during the illumination pauses is employed instead of the video modulator.

In order to achieve a good recording quality given the recording device, back reflections of light into the laser light source must be avoided, since they excite disturbing oscillations in the laser light source. Such back reflections can be caused directly by the unused secondary beam or by reflections of the secondary beam at optical components and housing parts, being caused as stray light when the light power of the undesired secondary beam is not completely and designationally eliminated in the light trap. Given the traditional light trap in the form of an absorption block, back reflections in the laser light source cannot, however, be completely avoided, so that the recording quality can be deteriorated.

EP 0 533 346 A and U.S. Pat No. 5,457,567 A already disclose laser recording devices wherein an illumination beam used for registration and an unused secondary beam are generated from an input laser beam in an acousto-optical modulator (AOM), and wherein the unwanted secondary beam is absorbed in a light trap. No specific exemplary embodiments for such light traps are recited in these publications.

Patent Abstracts of Japan, vol. 013, no. 407 (E-818), Sep. 8, 1989 and JP 01 146386 A (Toshiba Corp.), Jun. 8, 1989, already disclose a light trap that is composed of a cylindrical hollow body, whose one face side forms the light entry aperture, and of an axially symmetrically arranged, conically shaped reflector.

However, these known light traps do not allow back reflections into the laser light source of a laser recording device to be adequately avoided, so that the recording quality can be deteriorated.

SUMMARY OF THE INVENTION

It is therefore an object of the present invention to improve a method and an apparatus for the elimination of light by absorption, preferably in an electronic recording device for point-by-point and line-by-line illumination of the recording material, such that disturbing back reflections into the light source are avoided in order to achieve a high recording quality.

According to the method and apparatus of the invention for illumination of light by absorption, light is conducted through a light entry aperture into a hollow member having a light-absorbent inside surface. Light incident into the hollow member is conducted substantially onto an inside surface of the hollow member with a reflector situated in the hollow member. The hollow member with the light-absorbent inside surface is designed as a hollow sphere. The light entry aperture of the hollow sphere is selected so large that unwanted light to be absorbed proceeds into the hollow sphere without light scatter. A reflection face of the reflector is designed at least as a spherical section facing toward the light entry aperture and arranged at an inside surface of the hollow sphere facing away from the light entry aperture. The reflection face of the reflector is positioned within the hollow sphere such that the light incident through the light entry aperture and reflected from the reflection face is not reflected onto itself, such that an optimally slight part of the reflected light does not proceed toward the outside through the light entry aperture as stray light, and such that an optimally great part of the reflected light is absorbed by the inside surface of the hollow sphere.

The invention is explained in greater detail below with reference to FIGS. 1 through 3.

DESCRIPTION OF THE PREFERRED EMBODIMENTS

Figure 1:
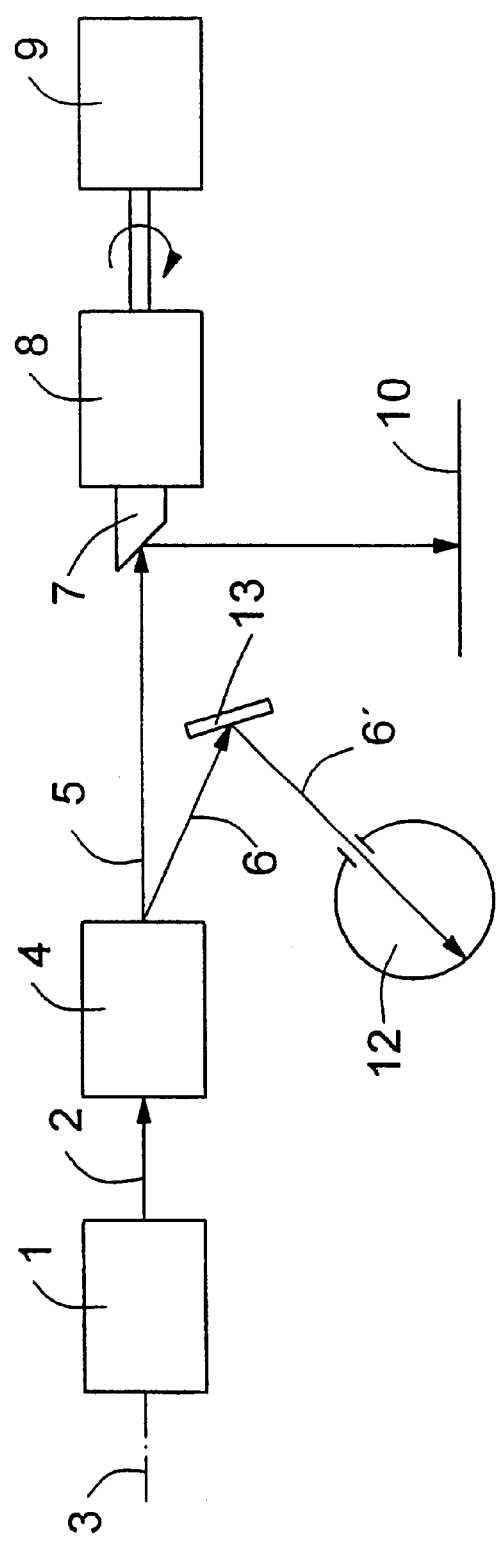
FIG. 1 is a schematic block circuit diagram of an electronic recording apparatus with a device for light absorption.

FIG. 1 shows the schematic structure of an electronic recording apparatus for the point-by-point and line-by-line illumination of a recording material. A laser light source 1, for example a YAG laser, creates a laser beam 2 along an optical axis 3. The laser beam 2 impinges a video modulator 4 that, for example, is designed as an acousto-optical modulator. The functioning and structure of acousto-optical modulators (AOM) are known. The video modulator 4 generates essentially a used output laser beam of the first order, referred to below as illumination beam 5, and an unused output laser beam of the 0 order, referred to below as secondary beam 6, from the input laser beam 2.

The illumination beam 5 emerging from the video modulator 4 is incident onto a mirror 7 oriented obliquely relative to the optical axis 3 in a light beam deflection unit 8 that rotates around the optical axis 3 with a rotational drive 9. The light beam deflection beam 8 deflects the illumination beam 5 reflected at the mirror 7 in a deflection plane proceeding perpendicular to the plane of the drawing over a recording material 10 to be illuminated point-by-point and line-by-line. In the case of a flatbed device, the recording material 10 is fixed on a planar holder and, in the case of an inside drum device, is fixed to the inside surface of a stationary holder or illumination trough shaped like a cylindrical segment.

A two-level video signal (V) on a line 11 controls the video modulator 4 that turns the illumination beam 5 on and off in conformity with the information to be recorded.

The unused secondary beam 6 is conducted into a device of the for light absorption, called light trap 12 in brief, in order to avoid disturbing back reflections into the laser light source 1, this device for light absorption being only schematically indicated in FIG. 1.

Since the secondary beam 6 and the illumination beam 5 are output from the video modulator 4 with a very small separation angle, the secondary beam 6 is advantageously conducted into the light trap 12 via a deflection mirror 13 for structural reasons. In order to avoid having disturbing back reflections proceed from the deflection mirror 13 itself, the deflection mirror 13 should exhibit a low peak-to-valley height. The deflection mirror 13 is therefore designed, for example, as a polished metal mirror that reflects an optimally great light portion of the secondary beam 6 directly into the light trap and absorbs an optimally slight light part or reflects as disturbing stray light.

Figure 2:
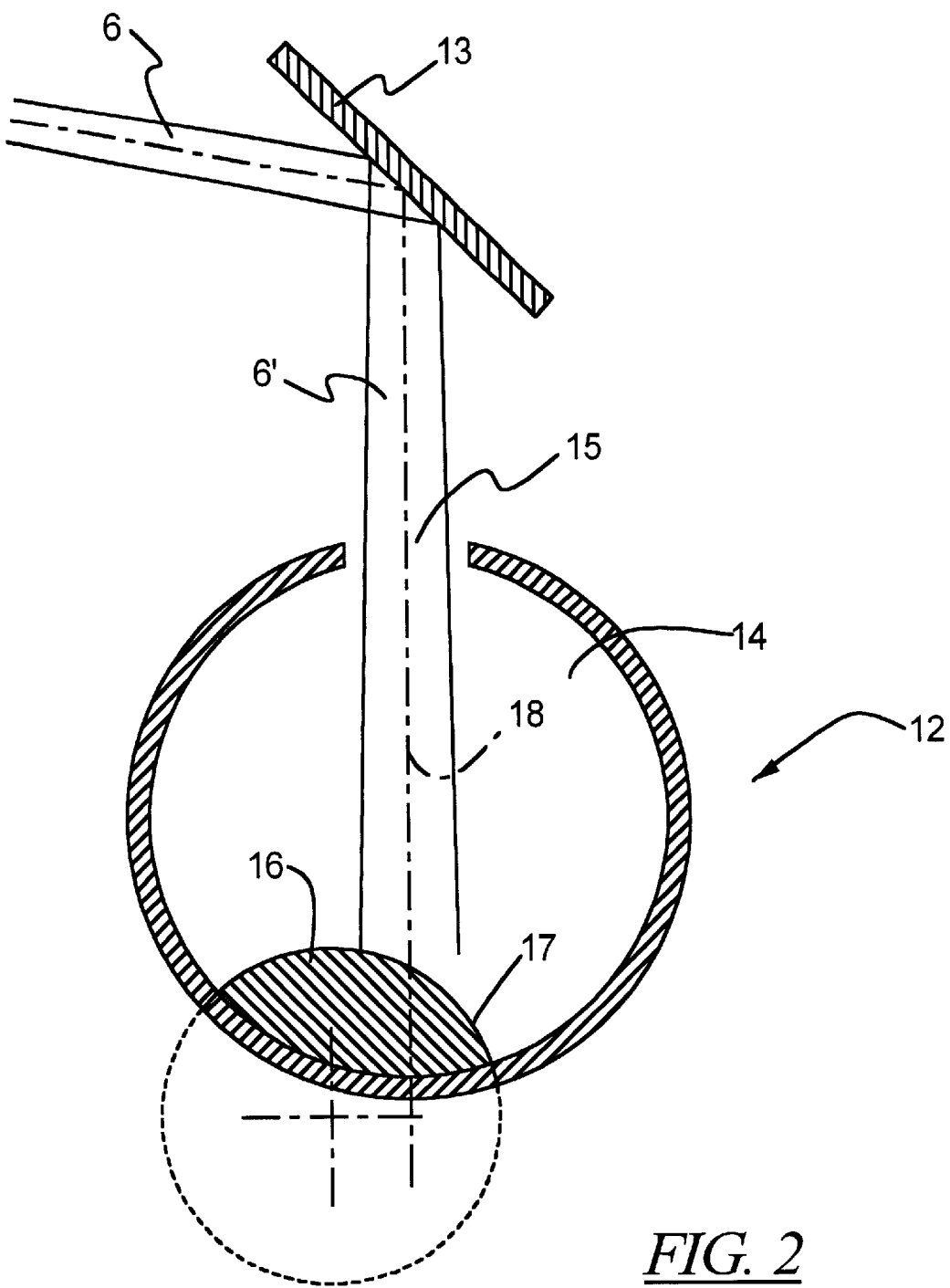
FIG. 2 is a first exemplary embodiment of an apparatus for light absorption.

FIG. 2 shows a first exemplary embodiment of a light trap in section. The light trap 12 is essentially composed of a hollow member 14 having a light-absorbent inside surface. The hollow member 14, for example in the form of a hollow sphere, comprises a light entry aperture 15 whose position and size are selected so large that the secondary beam 6' reflected by the deflection mirror 13 enters into the hollow sphere 14 unimpeded, i.e. without creating stray light. For example, the diameter of the circular light entry aperture 15 is at least twice as great as the diameter $1/e^2$ of the Gaussian profile of the secondary beam 6' passing through the light entry aperture 15.

A reflector 16, whose reflection face 17 faces toward the light entry aperture 15 of the hollow sphere 14, is located at the inside surface of the hollow sphere 14 that faces away from the light entry aperture 15. The reflection face 17 is designed, for example, as a polished metal surface so that little stray light arises.

The reflection face 17 is positioned such in the hollow sphere 14 and is selected so large that the secondary beam 6' incident through the light entry aperture 15 falls completely onto the reflection face 17. The reflection face 17 is designed such that the secondary beam 6' incident into the hollow sphere 14 is not reflected onto itself at the reflection face 17, such that an optimally slightly light part of the secondary beam 6' reflected by the reflection face 17 does not emerge toward the outside through the light entry aperture 15 of the hollow sphere 14, and such that an optimally great light part of the secondary beam 6' is incident onto the inside surface of the hollow sphere 14 and is absorbed thereat directly or after multiple reflections at the inside surface.

The reflector 16 is designed, for example, as a spherical section whose surface forms the reflection face 17. The spherical section is then attached to the inside surface of the hollow sphere 14. Alternatively, the reflector 16 can also be designed as a solid sphere, where the surface of a corresponding spherical section forms the reflection face 17. In this case, the solid sphere has the corresponding spherical section projecting into the hollow sphere 14, or the solid sphere was pressed into the inside surface of the hollow sphere 14 such that only the part of the solid sphere corresponding to the spherical section projects into the hollow sphere 14.

The spherical section or solid sphere are then positioned such that the imaginary mid-point of the spherical section or, the mid-point of the solid sphere exhibits a radial offset relative to the optical axis 18 of the secondary beam 6' amounting to one-fourth of the sphere radius, whereby the sphere radius is selected at least two times greater than the diameter $1/e^2$ of the Gaussian profile of the secondary beam 6'.

In a practical exemplary embodiment, the hollow sphere 14 is formed, for example, in that two work pieces are each respectively provided with a hemispherical bore, and the workpieces are then arranged relative to one another such that the hemispherical bores supplement one another to form a hollow sphere 14, whereby one of the workpieces comprises a bore that forms the light entry aperture 15 of the hollow sphere 14.

Figure 3:
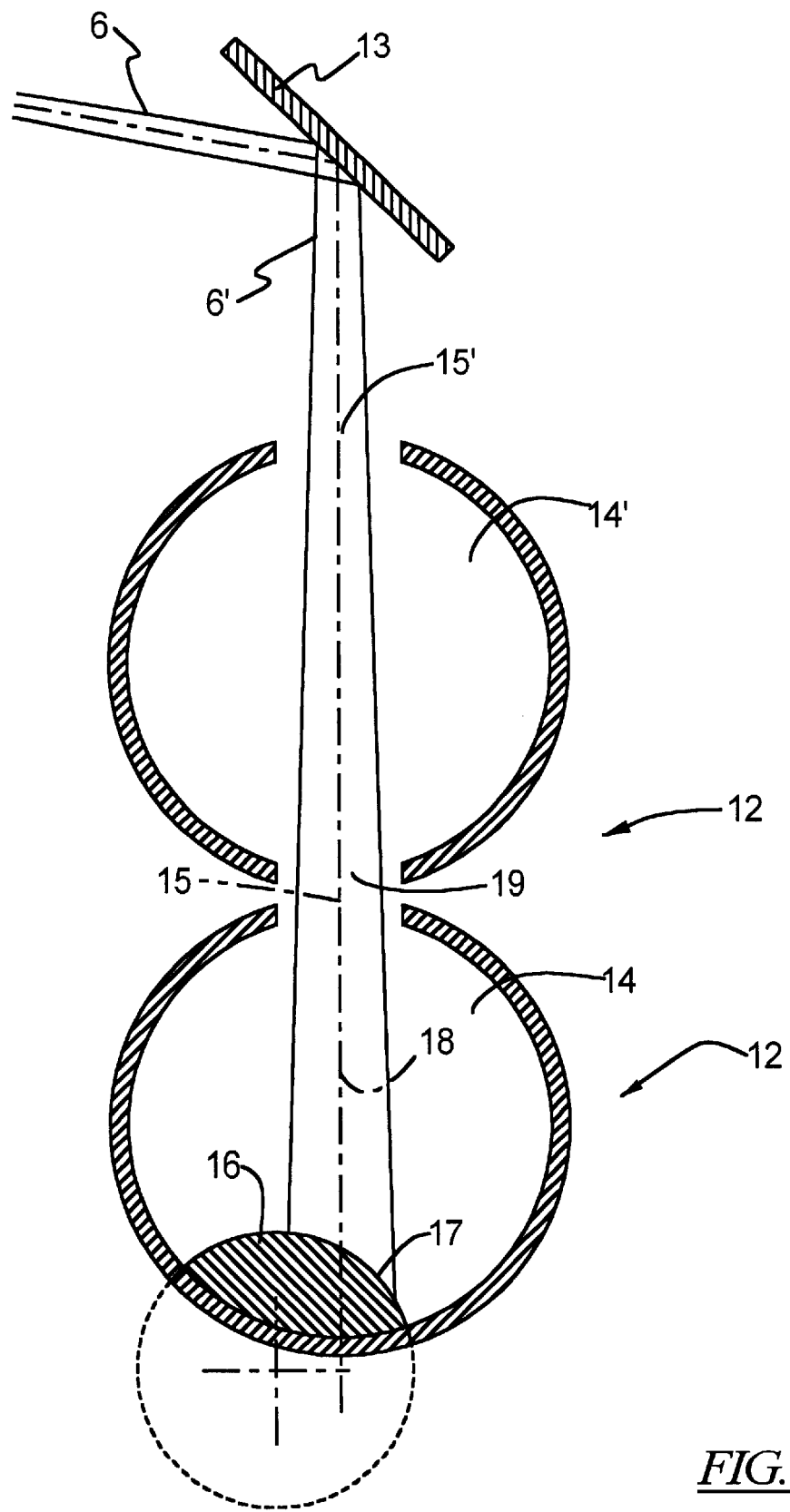
FIG. 3 is a second exemplary embodiment of an apparatus for light absorption.

FIG. 3 shows a second exemplary embodiment of a light trap. If a slight amount of stray light should nonetheless emerge from the hollow sphere 14 through the light entry aperture 15, this causing disturbing back reflections in the laser light source 1, the light trap 12 can be inventively supplemented by at least one further hollow sphere 14' upstream thereof in the direction of the deflection mirror 13. The preceding hollow sphere 14' comprises a light entry aperture 15' and a light exit aperture 19 that is arranged directly over the light entry face 15 of the first hollow sphere 14. The preceding hollow sphere 14' inventively sees to it that the stray light that still potentially emerges from the first hollow sphere 14 is advantageously completely absorbed in the preceding, second hollow sphere 14'. The diameters of the light entry aperture 15' and the light exit aperture 19 of the preceding hollow sphere 14' as well as of the light entry aperture 15 of the first hollow sphere 14 are dependent on the divergence of the secondary beam 6'.

Although various minor changes and modifications might be proposed by those skilled in the art, it will be understood that our wish is to include within the claims of the patent warranted hereon all such changes and modifications as reasonably come within our contribution to the art.

What is claimed is:

1. A method for elimination of light by absorption, comprising the steps of:

conducting light through a light entry aperture into a hollow member having a light-absorbent inside surface;

conducting light incident into the hollow member substantially onto an inside surface of the hollow member with a reflector situated in the hollow member, said incident light having a central axis;

designing the hollow member with the light-absorbent inside surface as a hollow sphere;

selecting the light entry aperture of the hollow sphere so large that unwanted light to be absorbed proceeds into the hollow sphere without light scatter;

designing a reflection face of said reflector at least as a spherical section facing toward the light entry aperture and arranging it at an inside surface of the hollow sphere facing away from the light entry aperture; and positioning the reflection face of the reflector within the hollow sphere such that a center of said reflection face is off-axis of said central axis of the incident light so that the incident light through the light entry aperture and reflected from the reflection face is not reflected onto itself, such that an optimally slight part of the reflected light does not proceed toward the outside through the light entry aperture as stray light, and such that an optimally great part of the reflected light is absorbed by the inside surface of the hollow sphere.

2. A method for elimination of light by absorption, comprising the steps of:
  conducting light through a light entry aperture into a hollow member having a light-absorbent inside surface;
  conducting light incident into the hollow member substantially onto an inside surface of the hollow member with a reflector situated in the hollow member;
  designing the hollow member with the light-absorbent inside surface as a hollow sphere;
  selecting the light entry aperture of the hollow sphere so large that unwanted light to be absorbed proceeds into the hollow sphere without light scatter;
  designing a reflection face of said reflector at least as a spherical section facing toward the light entry aperture and arranging it at an inside surface of the hollow sphere facing away from the light entry aperture;
  positioning the reflection face of the reflector within the hollow sphere such that the light incident through the light entry aperture and reflected from the reflection face is not reflected onto itself, such that an optimally slight part of the reflected light does not proceed toward the outside through the light entry aperture as stray light, and such that an optimally great part of the reflected light is absorbed by the inside surface of the hollow sphere;
  at least one further hollow member designed as a hollow sphere having a light entry face, a light exit face lying diametrically opposite the light entry face and having a light-absorbent inside surface is provided; and
  the further hollow sphere is arranged preceding the first hollow member with the light entry aperture and with the reflector such that the light exit aperture of the further hollow sphere lies in front of the light entry aperture of the first hollow sphere, the unwanted light enters into the first hollow member through the light entry aperture and the light exit aperture of the further hollow member and is absorbed thereat, and the stray light potentially emerging through the light entry surface of the first hollow sphere is absorbed at the inside surface of the further hollow sphere.

3. The method according to claim 1 wherein the unwanted light is laser light.

4. A device for the elimination of light by absorption, comprising:
  a hollow member with a light-absorbent inside surface and a light entry aperture for unwanted light;
  a reflector located in the hollow member that conducts light incident into the hollow member substantially onto the inside surface of the hollow member, said incident light having a central axis;
  the hollow member with the light-absorbent inside surface comprises a hollow sphere;
  the light entry aperture of the hollow sphere is selected so large that the unwanted light to be absorbed proceeds into the hollow sphere without light scatter;
  the reflection face of the reflector is designed at least as a spherical section facing toward the light entry aperture and is arranged at an inside surface of the hollow sphere facing away from the light entry aperture; and
  the reflection face of the reflector is positioned within the hollow sphere such that a center of said reflection face is off-axis of said central axis of the incident light so that the light incident through the light entry aperture and reflected from the reflection face is not reflected onto itself, such that an optimally slight part of the reflected light does not proceed toward the outside through the light entry aperture as stray light, and such that an optimally great part of the reflected light is absorbed by the inside surface of the hollow sphere.

5. The device according to claim 4 wherein
  at least one further hollow member designed as a hollow sphere having a light entry face, a light exit face lying diametrically opposite the light entry face and having a light-absorbent inside surface is provided; and
  the further hollow sphere is arranged preceding the first hollow member with the light entry aperture and with the reflector such that the light exit aperture of the further hollow sphere lies in front of the light entry aperture of the first hollow sphere, the unwanted light enters into the first hollow member through the light entry aperture and the light exit aperture of the further hollow member and is absorbed thereat, and the stray light potentially emerging through the light entry surface of the first hollow sphere is absorbed at the inside surface of the further hollow sphere.

6. The device according to claim 4 wherein
  the reflector is designed as a spherical section; and
  the reflector is attached at the inside surface of the hollow member.

7. The device according to claim 4 wherein
  the reflector is designed as a solid sphere where a spherical section forms the reflection face; and
  the spherical section forming the reflection face projects into the hollow member.

8. The device according to claim 4 wherein
  the reflector is designed as a solid sphere where a spherical section forms the reflection face; and
  the solid sphere is pressed into the inside surface of the hollow sphere such that only the part of the solid sphere corresponding to the spherical section projects into the hollow member.

9. A method for elimination of laser light by absorption in an electronic recording device for point-by-point and line-by-line exposure of a recording material with an illumination beam, comprising the steps of:
  generating a laser beam in a laser light source;
  modulating the laser beam in an acousto-optical modulator, where the laser beam is split substantially into an illumination beam for illumination of the recording material and into an unwanted secondary beam;
  eliminating the unwanted secondary beam with an absorption element;
  in order to avoid back reflections into the laser light source, conducting the secondary beam through a light entry aperture into a hollow member as a hollow sphere as said absorption element having a light-absorbent inside surface, said secondary beam having a central axis;
  selecting the light entry aperture of the hollow sphere so large that the secondary beam proceeds into the hollow sphere without light scatter;
  making the secondary beam conducted into the hollow sphere incident onto a reflection face of a reflector arranged at that inside surface of the hollow sphere facing away from the light entry aperture, said reflector being at least designed as a spherical section; and
  designing the reflection face of the reflector as a spherical section and positioned within the hollow sphere such that a center of said reflection face is off-axis of said central axis of the incident light so that the incident light through the light entry aperture and reflected from the reflection face is not reflected onto itself, such that an optimally slight part of the reflected light does not proceed toward the outside through the light entry aperture as stray light, and such that an optimally great part of the reflected light is absorbed by the inside surface of the hollow sphere.

10. A method for elimination of laser light by absorption in an electronic recording device for point-by-point and line-by-line exposure of a recording material with an illumination beam, comprising the steps of:

generating a laser beam in a laser light source;

modulating the laser beam in an acousto-optical modulator, where the laser beam is split substantially into an illumination beam for illumination of the recording material and into an unwanted secondary beam;

eliminating the unwanted secondary beam with an absorption element;

in order to avoid back reflections into the laser light source, conducting the secondary beam through a light entry aperture into a hollow sphere as an absorption element having a light-absorbent inside surface;

selecting the light entry aperture of the hollow sphere so large that the secondary beam proceeds into the hollow sphere without light scatter;

making the secondary beam conducted into the hollow sphere incident onto a reflection face of a reflector arranged at that inside surface of the hollow sphere facing away from the light entry aperture, said reflector being at least designed as a spherical section;

designing the reflection face of the reflector as a spherical section positioned within the hollow sphere such that the light incident through the light entry aperture and reflected from the reflection face is not reflected onto itself, such that an optimally slight part of the reflected light does not proceed toward the outside through the light entry aperture as stray light, and such that an optimally great part of the reflected light is absorbed by the inside surface of the hollow sphere;

providing at least one further hollow member as a hollow sphere having a light entry aperture, a light exit aperture lying diametrically opposite the light entry aperture and having a light-absorbent inside surface;

analyzing the further hollow sphere in front of the first hollow sphere with the light entry aperture and the reflector such that the secondary beam enters into the first hollow sphere through the light entry aperture and the light exit aperture of the further hollow sphere; and absorbing the stray light potentially emerging through the light entry aperture of the first hollow sphere at the inside surface of the further hollow sphere.

11. A device for elimination of laser light in an electronic recording device for point-by-point and line-by-line exposure of a recording material with an illumination beam, comprising:

a laser generator for generating a laser beam;

an acousto-optical modulator for modulation of the laser beam, whereby the modulator splits the laser beam substantially into an illumination beam and into an unwanted secondary beam;

an absorption element for elimination of the unwanted secondary beam;

the absorption element comprising a hollow member designed as a hollow sphere with a light entry aperture for the secondary beam and a light-absorbent inside surface;

a reflector having a reflection face facing toward the light entry aperture and designed as at least a spherical section arranged at that inside surface of the hollow sphere lying opposite the light entry aperture for reflection of the secondary beam incident through the light entry aperture, said secondary beam having a central axis; and the reflection face is designed as a spherical section and positioned in the hollow sphere such that a center of said reflection face is off-axis of said central axis of the incident light so that the secondary beam reflected by the reflection face is not reflected onto itself, such that an optimally slight part of the reflected secondary beam does not proceed toward the outside through the light entry aperture as stray light, and such that an optimally great part of the reflected secondary beam proceeds onto the inside surface of the hollow sphere and is absorbed thereat.

12. The device according to claim 11 wherein at least one further hollow member as a hollow sphere having a light entry aperture, a light exit aperture lying diametrically opposite the light entry aperture and having a light-absorbent inside surface is provided; and the further hollow sphere is arranged in front of the first hollow sphere with the light entry aperture and the reflector such that the light exit aperture of the further sphere lies in front of the light entry aperture of the first hollow sphere, the secondary beam enters into the first hollow sphere through the light entry aperture and the light exit aperture of the further hollow sphere, and the stray light potentially emerging through the light entry aperture of the first hollow sphere is absorbed at the inside surface of the further hollow sphere.

13. A method for elimination of light by absorption, comprising the steps of:

conducting light through a light entry aperture into a hollow member having a light-absorbent inside surface;

conducting light incident into the hollow member substantially onto an inside surface of the hollow member with a reflector situated in the hollow member, said incident light having a central axis;

designing the hollow member with the light-absorbent inside surface as a hollow sphere;

selecting the light entry aperture of the hollow sphere so large that unwanted light to be absorbed proceeds into the hollow sphere without light scatter;

designing a reflection face of said reflector at least as a spherical section facing toward the light entry aperture and arranging it at an inside surface of the hollow sphere remote from the light entry aperture; and positioning the reflection face of the reflector within the hollow sphere such that a center of said reflection face is off-axis of said central axis of the incident light so that an optimally slight part of the reflected light does not proceed toward the outside through the light entry aperture as stray light, and such that an optimally great part of the reflected light is absorbed by the inside surface of the hollow sphere.

* * * * *